United States Patent
Minervini et al.

(10) Patent No.: US 10,587,942 B1
(45) Date of Patent: Mar. 10, 2020

(54) LIQUID-RESISTANT PACKAGING FOR ELECTRO-ACOUSTIC TRANSDUCERS AND ELECTRONIC DEVICES

(71) Applicant: Apple Inc, Cupertino, CA (US)

(72) Inventors: Anthony D. Minervini, Sunnyvale, CA (US); David S. Wilkes, Jr., San Jose, CA (US); Nikolas T. Vitt, Sunnyvale, CA (US); Peter C. Hrudey, Cupertino, CA (US); Ruchir M. Dave, San Jose, CA (US); Amin M. Younes, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/146,983

(22) Filed: Sep. 28, 2018

(51) Int. Cl.
*H04R 1/08* (2006.01)
*B81B 3/00* (2006.01)
*B81B 7/00* (2006.01)

(52) U.S. Cl.
CPC .......... *H04R 1/086* (2013.01); *B81B 3/0021* (2013.01); *B81B 3/0027* (2013.01); *B81B 7/0006* (2013.01); *B81B 7/0038* (2013.01); *B81B 2201/0257* (2013.01); *H04R 2201/003* (2013.01)

(58) Field of Classification Search
CPC .............. H04R 1/086; H04R 2201/003; B81B 7/0038; B81B 7/0006; B81B 3/0021; B81B 3/0027; B81B 2201/0257
USPC ......................................................... 381/361
See application file for complete search history.

(56) References Cited

U.S. PATENT DOCUMENTS

| 6,535,460 | B2 | 3/2003 | Loeppert et al. |
| 7,642,575 | B2 | 1/2010 | Wong et al. |
| 7,894,621 | B2 * | 2/2011 | Jensen .................... H04R 1/086 381/322 |
| 8,055,003 | B2 * | 11/2011 | Mittleman ............ H04M 1/035 381/345 |
| 8,229,153 | B2 * | 7/2012 | Mittleman ............ H04M 1/035 381/191 |
| 8,571,239 | B2 | 10/2013 | Feiertag et al. |
| 8,624,384 | B1 * | 1/2014 | Minervini ............. B81B 7/0061 257/704 |

(Continued)

FOREIGN PATENT DOCUMENTS

| CN | 201491214 | 5/2010 |
| CN | 104023299 | 9/2014 |
| GB | 2563461 | 12/2018 |

*Primary Examiner* — Oyesola C Ojo
(74) *Attorney, Agent, or Firm* — Ganz Pollard, LLC

(57) ABSTRACT

A liquid-resistant microphone assembly includes a substrate defining a sound-entry region and a microphone transducer coupled with the substrate. The transducer has a sound-responsive region acoustically coupled with the sound-entry opening defined by the substrate. A liquid-resistant port membrane spans across the sound-entry opening defined by the substrate. The membrane is gas-permeable. An adhesive layer is positioned between the substrate and the liquid-resistant port membrane, coupling the liquid-resistant port membrane with the substrate and spacing the liquid-resistant port membrane from the substrate to form a gap between the membrane and the substrate. The adhesive layer defines an aperture having a periphery extending around and positioned outward of the sound-entry region. Modules and electronic devices incorporating such a microphone transducer also are disclosed.

23 Claims, 9 Drawing Sheets

(56) References Cited

U.S. PATENT DOCUMENTS

| | | | |
|---|---|---|---|
| 9,040,360 B1* | 5/2015 | Minervini | H04R 19/016 |
| | | | 257/704 |
| 9,131,315 B2 | 9/2015 | Mietta | |
| 9,139,422 B1 | 9/2015 | Minervini | |
| 9,232,302 B2 | 1/2016 | Minoo et al. | |
| 9,359,188 B1 | 6/2016 | Bharatan | |
| 9,392,376 B2 | 7/2016 | Khenkin et al. | |
| 9,745,188 B1 | 8/2017 | Dehe et al. | |
| 9,811,121 B2* | 11/2017 | Cardinali | G06F 1/1656 |
| 9,936,584 B2 | 4/2018 | Ye | |
| 9,961,452 B2 | 5/2018 | Salmon | |
| 2007/0113964 A1* | 5/2007 | Crawford | H04R 1/086 |
| | | | 156/249 |
| 2013/0161702 A1 | 6/2013 | Chen | |
| 2013/0223656 A1* | 8/2013 | Iuchi | H04R 1/023 |
| | | | 381/189 |
| 2014/0042565 A1 | 2/2014 | Fuergut et al. | |
| 2014/0044297 A1* | 2/2014 | Loeppert | H04R 1/086 |
| | | | 381/355 |
| 2014/0064542 A1* | 3/2014 | Bright | H04R 1/086 |
| | | | 381/359 |
| 2014/0064546 A1* | 3/2014 | Szczech | H04R 1/04 |
| | | | 381/361 |
| 2015/0061048 A1 | 3/2015 | Escher-Poeppel et al. | |
| 2015/0237431 A1* | 8/2015 | Jeziorek | H04R 1/086 |
| | | | 381/361 |
| 2016/0037243 A1* | 2/2016 | Lippert | H04R 1/023 |
| | | | 381/166 |
| 2017/0107100 A1 | 4/2017 | Cheng et al. | |
| 2017/0247251 A1 | 8/2017 | Chu et al. | |
| 2018/0115811 A1* | 4/2018 | Zhang | H04R 1/023 |

* cited by examiner

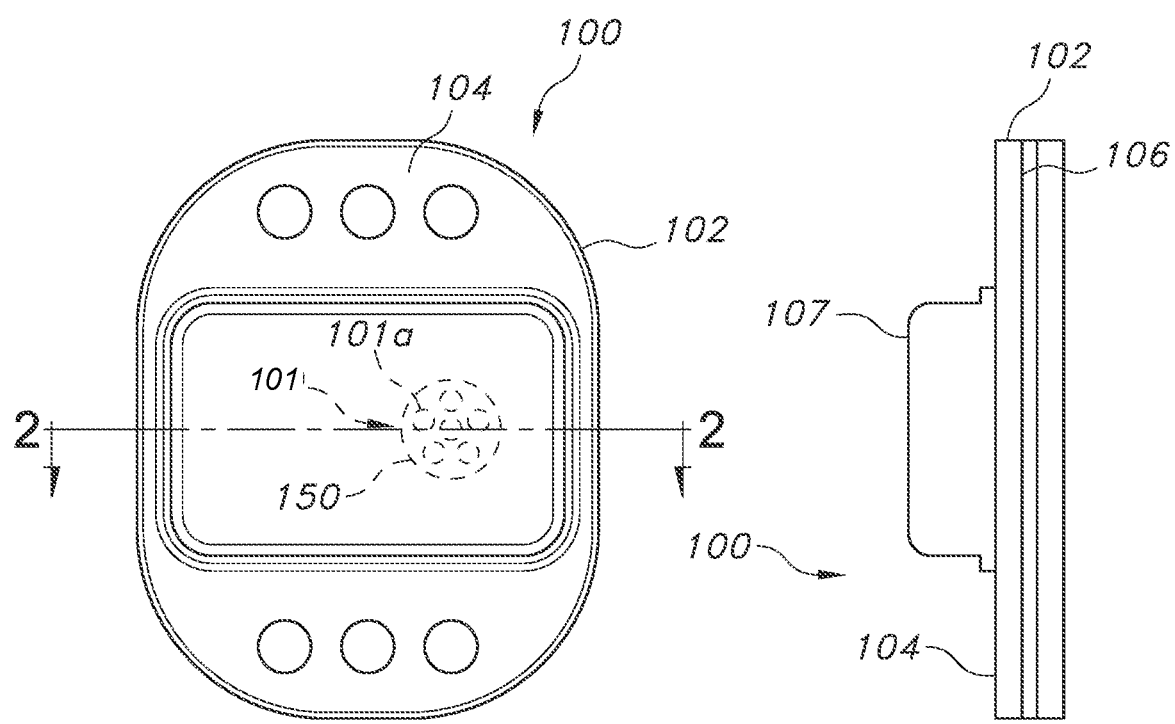
FIG. 1A
FIG. 1C
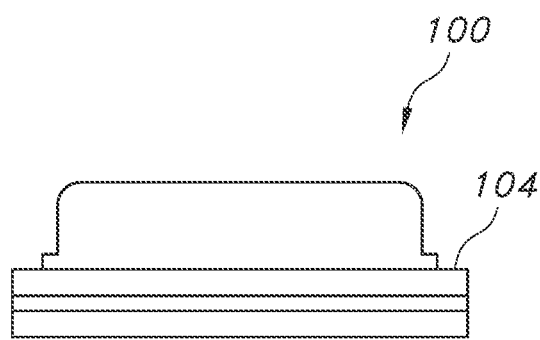
FIG. 1B

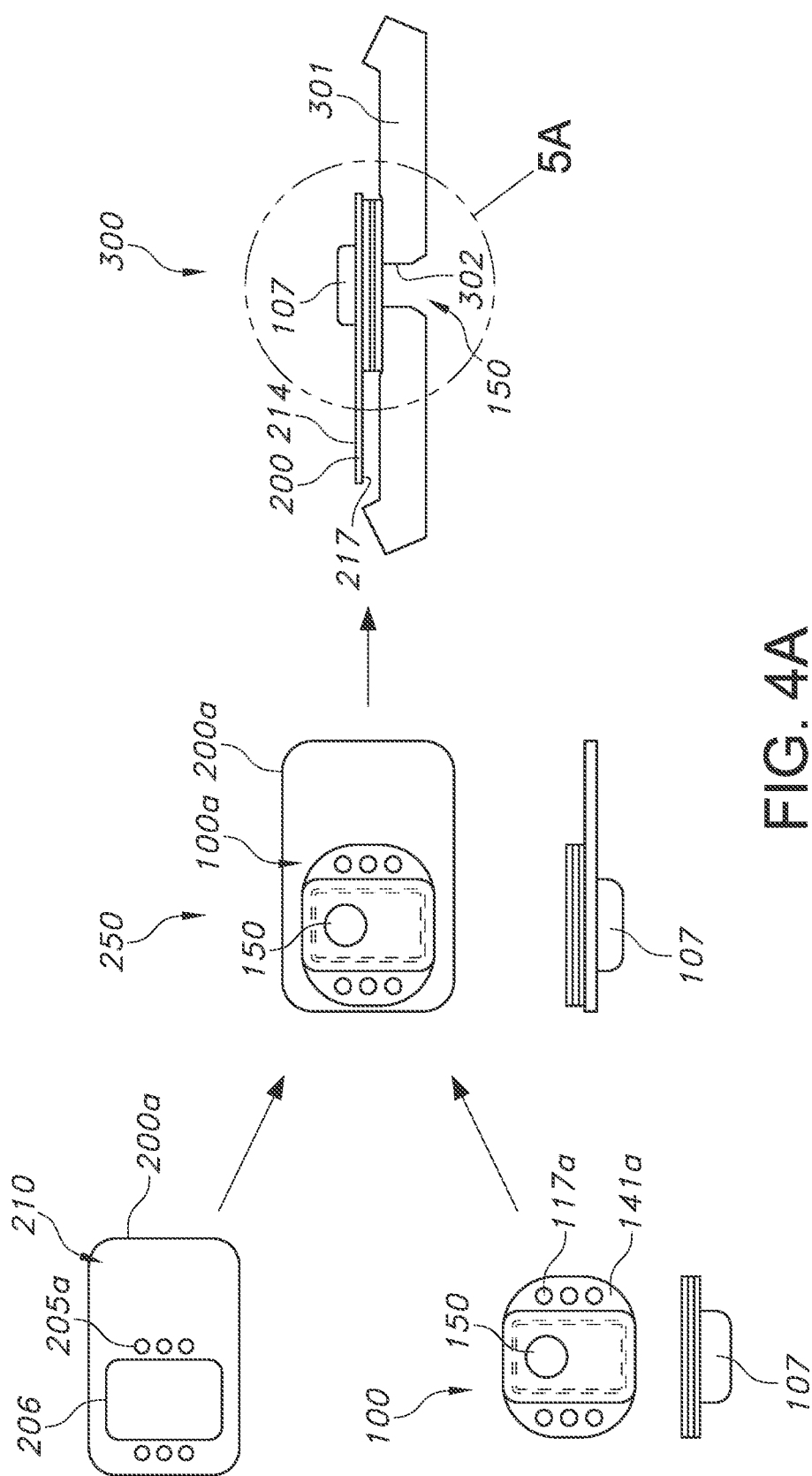

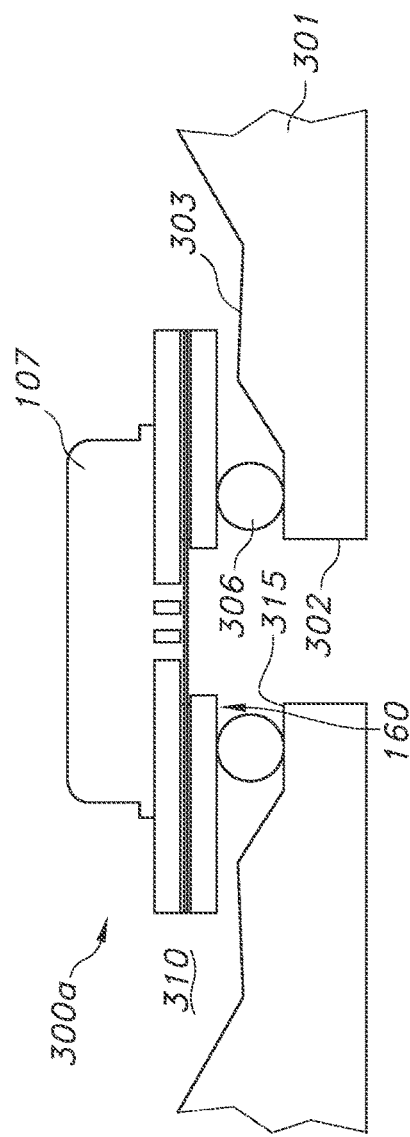
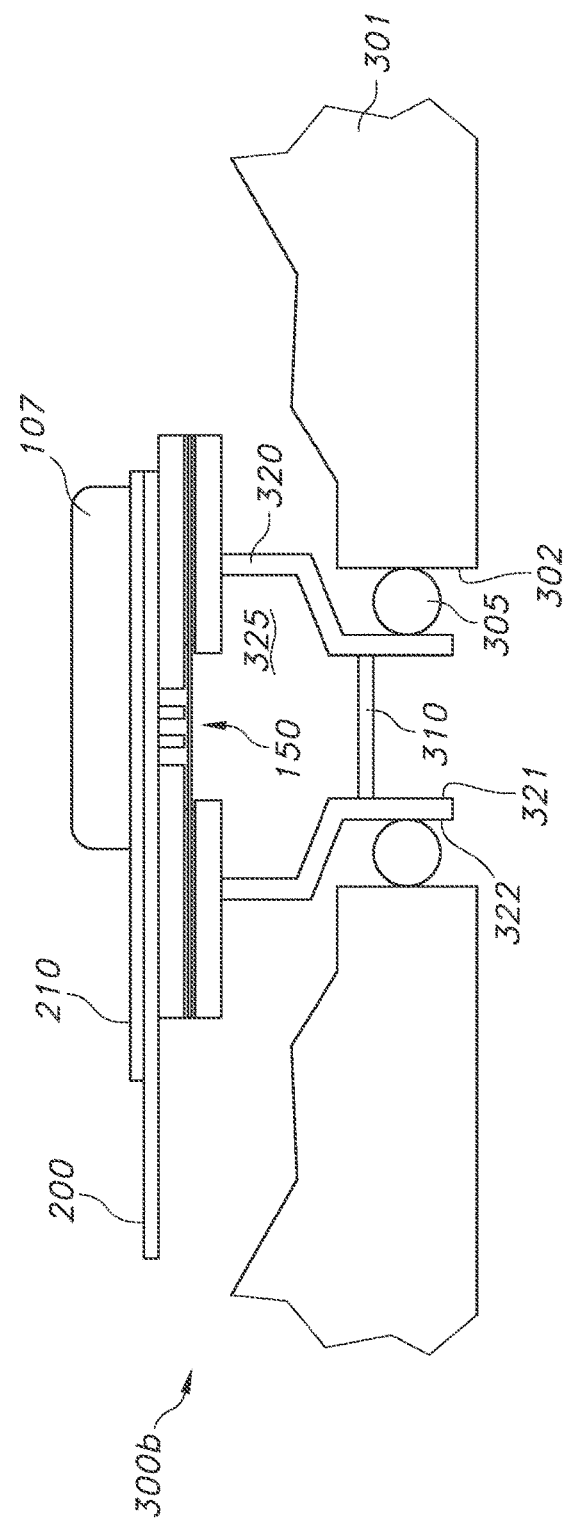

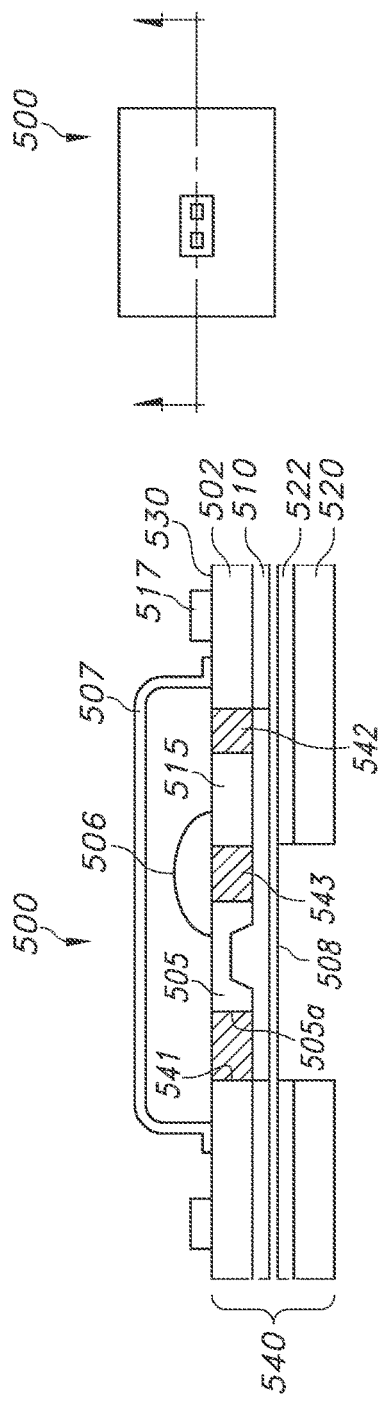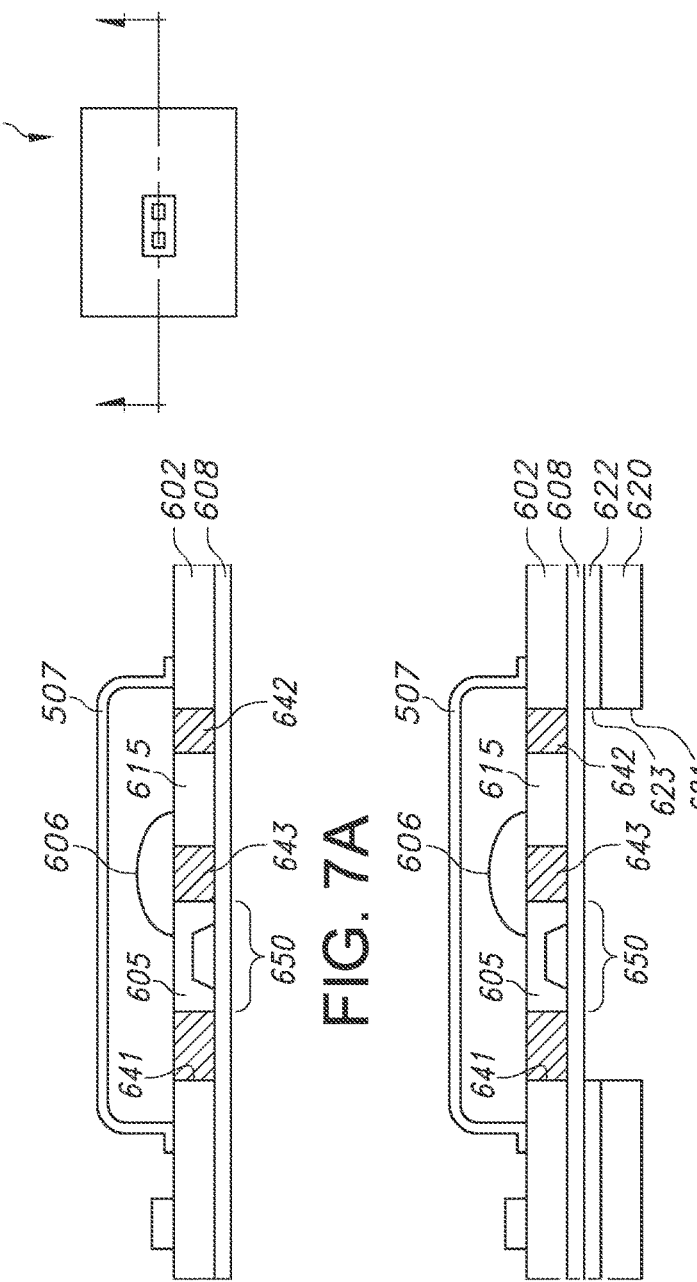

us 10,587,942 B1

LIQUID-RESISTANT PACKAGING FOR ELECTRO-ACOUSTIC TRANSDUCERS AND ELECTRONIC DEVICES

FIELD

This application and related subject matter (collectively referred to as the "disclosure") generally concern liquid-resistant packaging for electronic devices, electro-acoustic transducers, and related systems.

BACKGROUND INFORMATION

In general, sound (sometimes also referred to as an acoustic signal) constitutes a vibration that propagates through a carrier medium, such as, for example, a gas, a liquid, or a solid. An electro-acoustic transducer, in turn, is a device configured to convert an incoming acoustic signal to an electrical signal, or vice-versa. Thus, an acoustic transducer in the form of a loudspeaker can convert an incoming signal (e.g., an electrical signal) to an emitted acoustic signal, while an acoustic transducer in the form of a microphone can be configured to convert an incoming acoustic signal to an electrical (or other) signal.

Some electronic devices that incorporate an electro-acoustic transducer may be exposed to environments other than dry air, such as, for example, rain, or may be fully immersed in a liquid. As an example, users of some electronic devices may wish to fully immerse their electronic device in water during certain activities (e.g., when participating in a water sport, like swimming, surfing, rafting, wake boarding, etc.) Nonetheless, intrusion of water or another liquid into an electronic device can damage components in the device, including electro-acoustic transducers.

SUMMARY

Concepts, systems, methods, and apparatus disclosed herein overcome many problems in the prior art and address one or more of the aforementioned or other needs. For example, this application describes a variety of liquid-resistant packages, e.g., for microphone transducers (or other components), suitable to inhibit intrusion of water or other liquids past a selected package boundary. Such packages can be combined into an electronic device to inhibit intrusion of water into the electronic device, making the electronic device liquid resistant. As well, some disclosed substrates are compatible with liquid-resistance tests prior to final assembly with a liquid-sensitive component (e.g., a microphone transducer). By allowing testing prior to final assembly, yields of liquid-resistant modules (e.g., microphone modules) can be increased at final assembly.

According to a first aspect, a liquid-resistant microphone assembly includes a substrate defining opposed first and second major surfaces. A sound-entry region extends through the substrate from the first major surface to the second major surface. A microphone transducer couples with the substrate and has a sound-responsive region acoustically coupled with the sound-entry opening defined by the substrate. A liquid-resistant port membrane spans across the sound-entry opening defined by the substrate. The membrane is gas-permeable. An adhesive layer is positioned between the second major surface of the substrate and the liquid-resistant port membrane, coupling the liquid-resistant port membrane with the second major surface of the substrate. The liquid-resistant port membrane is spaced from the second major surface of the substrate according to a thickness of the adhesive layer, forming a gap between the membrane and the second major surface of the substrate. The adhesive layer defines an aperture having a periphery extending around the sound-entry region and positioned outward of the sound-entry region.

An acoustic mesh can be positioned opposite the substrate relative to the liquid-resistant port membrane. The acoustic mesh can be spaced apart from the liquid-resistant port membrane in a region adjacent the sound-entry opening.

In an embodiment, the microphone transducer comprises a MEMS microphone transducer.

The sound entry region can include a plurality of apertures extending from the first major surface of the substrate to the second major surface of the substrate. Each aperture can acoustically couple with the sound-responsive region of the microphone transducer.

In an embodiment, the microphone transducer can couple to the first major surface of the substrate.

In another embodiment, the microphone transducer can couple with the substrate at a position between the first major surface and the second major surface.

In an embodiment, the substrate according to the first aspect can be a first substrate, and the liquid-resistant microphone assembly can also include a second substrate positioned opposite the first substrate relative to the port membrane.

In an embodiment, the second substrate is adhesively coupled with the first substrate. For example, the adhesive layer of the first aspect can be a first adhesive layer, and the liquid-resistant microphone assembly can further include a second adhesive layer positioned between the liquid-resistant port membrane and the second substrate, coupling the second substrate to the liquid-resistant port membrane.

The sound-entry opening can be a first sound-entry opening, and the second substrate can define a second sound-entry opening acoustically coupled with the first sound-entry opening, as well as the sound-responsive region of the microphone transducer.

The first sound-entry opening has a corresponding first characteristic dimension and the second sound-entry opening has a corresponding second characteristic dimension. The second characteristic dimension can be greater than the first characteristic dimension.

As well, the aperture through the first adhesive layer can have a characteristic dimension larger than the characteristic dimension of the first sound-entry opening and larger than the characteristic dimension of the second sound-entry opening.

Similarly, the second adhesive layer can define an aperture having a characteristic dimension larger than the characteristic dimension of the first sound-entry opening and larger than the characteristic dimension of the second sound-entry opening.

An acoustic mesh can span across the second sound-entry opening.

In an embodiment, a housing can extend from a first end to an opposed second end. The housing defines a duct extending from the first end of the housing to the second end of the housing, and the second end of the housing sealably couples with the first substrate at a region outward of the sound-entry opening. An acoustic mesh can span across the duct at a position between the first end of the housing and the second end of the housing.

According to a second aspect, a microphone module includes an interconnect substrate having a plurality of electrical conductors. A liquid-resistant microphone package having a package substrate and a microphone transducer couples with the package substrate. The package substrate defines a sound-entry region having a corresponding periphery. The package also has a liquid-resistant and gas-permeable membrane. An adhesive layer positioned between the membrane and the package substrate defines an aperture having a corresponding periphery larger than the periphery of the sound-entry region defined by the package substrate. The adhesive layer adhesively secures the gas-permeable membrane to the package substrate such that the membrane spans across and is spaced apart from the sound-entry region. The package substrate also has a plurality of electrical contacts, and each electrical contact is electrically coupled with a corresponding electrical conductor in the interconnect substrate.

The package substrate can define a first major surface and an opposed second major surface. The sound-entry opening can be positioned adjacent the second major surface. The liquid-resistant microphone package can also include a lid overlying the microphone transducer adjacent the first major surface. The plurality of electrical contacts can be exposed from the first major surface and the interconnect substrate can be positioned adjacent the first major surface of the package substrate.

The interconnect substrate can define an aperture and the lid of the liquid-resistant microphone package can extend through the aperture.

According to another aspect, an electronic device includes an enclosure having a wall, and the wall defines an acoustic port. The electronic device also includes a liquid-resistant microphone assembly having a microphone transducer. The transducer defines a sound-responsive region. The microphone assembly also includes a package substrate defining a liquid-resistant sound-entry region acoustically coupling the sound-responsive region with the acoustic port. A periphery around the liquid-resistant sound-entry region sealably couples with a periphery around the acoustic port. The package substrate is a laminated construct including a substrate layer. The microphone transducer couples with the first substrate layer such that the sound-responsive region of the microphone transducer is exposed to the sound-entry region. A liquid-resistant, gas-permeable membrane layer spans across the sound-entry region. An adhesive layer is positioned between the substrate layer and the membrane layer, adhesively coupling the membrane layer with the substrate layer. The adhesive layer defines an aperture having a periphery extending around and positioned outward of the sound-entry region, forming a gap positioned between the membrane layer and the substrate layer within the sound-entry region of the package substrate.

In an embodiment of the electronic device, the substrate layer is a first substrate layer, defining a perforated region corresponding to the sound-entry region and having a corresponding periphery. In the embodiment, the adhesive layer is a first adhesive layer, and the package substrate further includes a second substrate layer and a second adhesive layer. The second substrate layer can be positioned opposite the first substrate layer relative to the membrane layer. The second substrate layer can define a perforated region acoustically coupled with the sound-responsive region of the microphone transducer. The perforated region defined by the second substrate region can have a corresponding periphery larger than the periphery of the perforated region of the first substrate. The second adhesive layer can be positioned between the second substrate layer and the membrane layer. The second adhesive layer can adhesively couple the second substrate layer with the membrane layer, and the second adhesive layer can define a corresponding aperture having a periphery. The periphery of the second adhesive layer can be positioned outward of the periphery of the perforated region of the first substrate layer and outward of the periphery of the perforated region of the second substrate layer.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

FIG. 1A illustrates a plan view from above a liquid-resistant microphone assembly.

FIG. 1B illustrates an end-elevation view of the assembly in FIG. 1A.

FIG. 1C illustrates a side-elevation view of the assembly in FIG. 1A.

FIG. 4A illustrates several components and sub-assemblies in an electronic device.

FIG. 5A illustrates detail of a sealable coupling between a liquid-resistant microphone assembly shown in FIGS. 4A and 4B with an enclosure for an electronic device.

FIG. 5B illustrates detail of an alternatively arranged sealable coupling.

FIG. 6 illustrates a cross-sectional view of an alternative arrangement for a liquid-resistant microphone assembly.

FIG. 7A illustrates a cross-sectional view of an alternative arrangement for a liquid-resistant microphone assembly having a MEMs microphone directly mounted to a liquid-resistant membrane.

FIG. 7B illustrates a cross-sectional view of a microphone assembly similar to that in FIG. 7A with an added stiffener or other substrate.

DETAILED DESCRIPTION

Figure 2A:
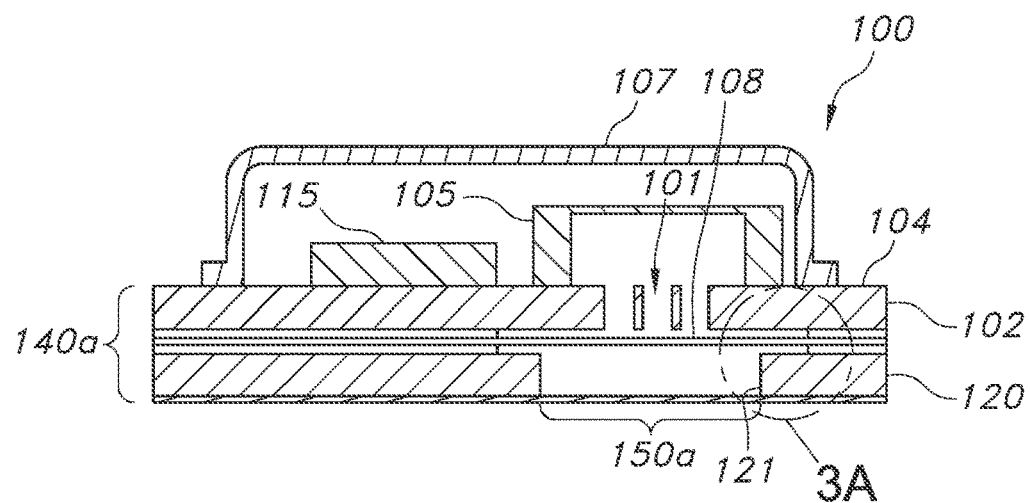
FIG. 2A illustrates a cross-sectional view of the assembly in FIG. 1A taken along section line 2-2.

The following describes various principles related to liquid-resistant packages, e.g., for microphone transducers (or other components), as well as electronic devices and related systems. For example, some disclosed principles pertain to systems, methods, and components that permit passage of acoustic energy with little or no damping while concurrently inhibiting intrusion of a liquid beyond a selected boundary of a component package. To illustrate, liquid-resistant microphone assemblies are described. That said, descriptions herein of specific appliance, apparatus or system configurations, and specific combinations of method acts, are just particular examples of contemplated appliance, apparatus or system configurations, and method combinations, chosen as being convenient to illustrate disclosed principles. One or more of the disclosed principles can be incorporated in various other appliance, apparatus or system configurations, and method combinations, to achieve any of a variety of corresponding, desired characteristics. Thus, a person of ordinary skill in the art, following a review of this disclosure, will appreciate that combinations having attributes that are different from those specific examples discussed herein can embody one or more presently disclosed principles, and can be used in applications not described herein in detail. Such alternative embodiments also fall within the scope of this disclosure.

I. Liquid-Resistant Package for Acoustic Transducer

Referring now to FIGS. 1A, 1B, 1C, 2A, 2B, and 2C, liquid-resistant component packages, e.g., for a microphone transducer, are illustrated and described. Each component package 100 has a substrate 102 defining a first major surface 104 and an opposed second major surface 106. The substrate 102 also defines at least one aperture 101a extending through the substrate from the first major surface 104 to the second major surface 106, defining a sound-entry opening 101 through the substrate 102. A microphone transducer 105 is mountably coupled with the substrate 102 on the first major surface 104 and has a sound-responsive diaphragm (not shown) acoustically coupled with the sound-entry opening 101 defined by the substrate, permitting sound to enter a front volume of the microphone transducer. A lid 107 overlies the microphone transducer 105 and is mounted to the substrate 102.

Opposite the microphone transducer 105 relative to the substrate 102, a liquid-resistant port membrane 108 is mountably coupled with the second major surface 106 (FIG. 3A) of the substrate 102. The port membrane 108 spans across the sound-entry opening 101 defined by the substrate 102. The membrane 108 is spaced apart from the second major surface 106 of the substrate 102, defining a gap Gi positioned between the membrane 108 and the second major surface 106 of the substrate. The port membrane 108 can be sufficiently gas permeable to permit acoustic energy to pass therethrough and yet inhibit passage of liquids therethrough, defining a gas-permeable, liquid-resistant region of the package 100. In another embodiment, the port membrane is gas- and liquid-impermeable under operating conditions for which the component package 100 is intended.

For example, the port membrane 108 can be sufficiently gas permeable as to be "acoustically transparent," e.g., by transmitting acoustic pressure waves across the port membrane with limited damping. As used herein, "acoustically transparent" means having an acoustic impedance less than about 45 MKS Rayls, such as, for example, between about 25 MKS Rayls and about 35 MKS Rayls. As well, some membranes prevent movement of water across the port membrane 108 when a hydrostatic pressure gradient across the port membrane falls below a selected threshold hydrostatic pressure gradient. Nonetheless, a port membrane 108 need not be acoustically transparent, particularly when other competing design priorities are addressed. For example, about 3.5 dB loss in sound power may be acceptable for some embodiments, e.g., embodiments expected to be exposed to relatively high (e.g., between 2 bar and 5 bar) hydrostatic pressure gradients.

In general, a suitable port membrane for a particular application can permit a flow of gas therethrough while being impermeable to a liquid at liquid breakthrough pressures below a selected threshold pressure. For example, pores in the port membrane 108 can measure between about 0.1 µm and about 10 µm, making the port membrane gas permeable while inhibiting liquid movement across the membrane. The membrane can have a thickness, t, measuring between about 5 µm and about 50 µm, e.g., between about 10 µm and about 30 µm, A representative example of a permeable port membrane 108 can be formed of PTFE or ePTFE, though other suitable materials can be used in place of or in addition to PTFE or ePTFE. Such materials include, for example, polymerized fibers (e.g., polyvinylidene fluoride, or polyvinylidene difluoride, both of which generally are referred to in the art as "PVDF" and are inert thermoplastic fluoropolymers produced by the polymerization of vinylidene difluoride).

As used herein, the term "PTFE" means polytetrafluoroethylene. PTFE, commonly referred to by the DuPont trademark Teflon® or the ICI trademark Fluon®, is well known for its chemical resistance, thermal stability, and hydrophobicity. Expanded PTFE, sometimes also referred to as ePTFE, has a porous structure defined by a web of interconnected fibrils. ePTFE commonly has a porosity of about 85% by volume, but because of its hydrophobicity, has a relatively high liquid breakthrough pressure (i.e., a threshold hydrostatic pressure below which the ePTFE remains impermeable to the liquid) for a variety of liquids, including water.

Other port-membrane embodiments can have a composite or a laminate construction. For example, plural layers of material can be laminated together. In one example, a woven or knit material can be laminated to ePTFE or PTFE to add tensile and/or shear strength to the membrane. In other embodiments, a composite port membrane can be formed by forming ePTFE (or other material) around a lattice structure (e.g., a knit or woven sheet material, like a fabric or screen, formed of any of a variety of materials). In some port-membrane embodiments, a coating or a treatment can be applied to enhance oleophobicity of the membrane.

Still other port-membrane embodiments may be impermeable to a gas, e.g., air or components thereof (e.g., nitrogen, oxygen). For example, a port membrane may have a non-porous structure or a porous structure in which the pores are smaller than selected gas molecules, preventing passage of the gas through the structure. With a gas-impermeable membrane, acoustic pressure variations (sometimes also referred to as sound waves) can be transferred across the membrane by inducing mechanical vibrations in the membrane from incident acoustic energy on a first membrane side. As the membrane vibrates, the vibrations can induce corresponding pressure variations on a second membrane side positioned opposite the first side. When using a non-porous or other gas-impermeable membrane, barometric venting of the component 100 may differ from venting used in connection with a porous or gas-permeable membrane. For example, a lateral vent can be provided within the substrate 140a, 140b, 140c extending from a region adjoining the side of the membrane 108 facing the microphone transducer 105 laterally outward of the lid 107. In an embodiment, the adhesive layer 110 can define a laterally extending channel (e.g., not shown but extending parallel to the cross-section in FIGS. 3A, 3B, 3C). In another embodiment, the substrate 102 can define such a channel or other vent passage to a region enclosed by the lid 107 or to a region external of the lid 107.

Figure 3A:
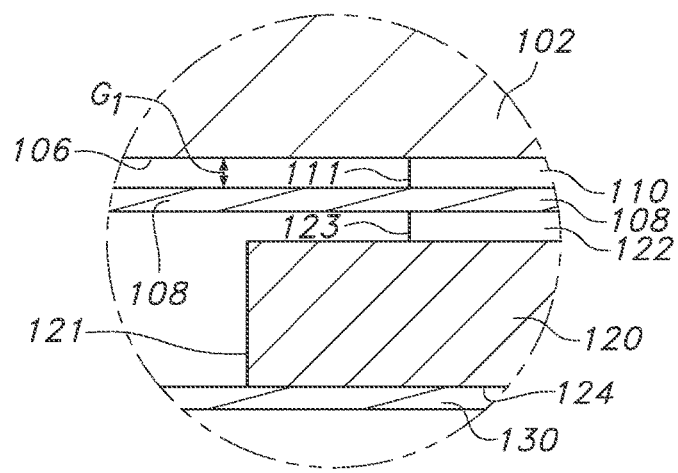
FIGS. 3A, 3B, and 3C show additional detail from FIGS. 2A, 2B, and 2C, respectively.
Figure 3B:
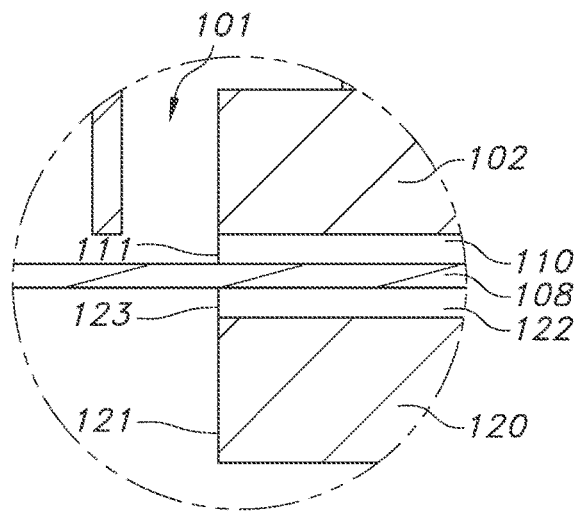

As FIGS. 2A and 3A illustrate by way of example, a peripheral region of the port membrane 108 can be adhesively secured to the second major surface 106 of the substrate 102 at a position outward of the sound-entry opening 101 of the substrate 102.

The region of attachment between the port membrane 108 and the substrate 102 can define a liquid-impermeable or at least a liquid-resistant adhesive bond. Thus, independently attaching the port membrane 108 to the substrate 102 can permit hydraulic leak testing of the substrate-and-membrane assembly prior to assembling the microphone transducer 105 to the substrate 102. A suitable adhesive bond can be formed using a temperature-sensitive adhesive tape 110 formed with an acrylic adhesive on opposed major surfaces of a polyester or a polyimide carrier. In one example, the adhesive tape can measure about 50 μm thick, e.g., between about 40 μm and about 60 μm, for example, between about 30 μm and about 70 μm.

A thickness of the adhesive tape 110 can be selected to space the port membrane 108 from a surface 106 of the substrate 102. A separation gap Gi (FIG. 3A) can reduce a likelihood that the port membrane 108 may impact or otherwise contact the substrate 102, e.g., near the sound-entry opening 101, when exposed to a threshold level of acoustic energy across a selected frequency band. For example, the port membrane 108 may tend to resonate when exposed to a selected frequency of acoustic energy, yet selecting an adhesive of a thickness greater than a likely amplitude of the membrane's vibration can prevent the port membrane 108 from contacting the substrate 102. Eliminating or preventing such a vibratory contact between the membrane 108 and the substrate 102 may be desirable, as such vibratory contact may impair an acoustic signal passing into the package 100.

Nonetheless, when exposed to hydraulic pressure, the membrane 108 can deform and be supported by the substrate 102. According to one aspect, the gap Gi is sized to maintain deformation of the membrane 108 to be elastic and to prevent plastic deformation of the membrane as the membrane deforms and contacts the substrate under a hydraulic pressure.

Under sufficient deformations of the port membrane 108, the port membrane can come into contact with and urge against the sound-entry region 101 of the substrate 102. A gap distance Gi between the substrate 102 and the port membrane 108 can be selected to ensure the material of the port membrane 108 remains within an elastic-deformation regime over a range of potential deformations (e.g., until the membrane 108 urges against and is supported by the second major surface of the substrate 102). Larger gap distances may allow a plastic deformation of the port membrane, permanently deforming the membrane and degrading acoustic performance, gas-permeability, or both. Despite advantages just described, the port membrane 108 can alternatively be attached to and supported by the first major surface 104 of the substrate 102, e.g., between the microphone transducer 105 and the first major surface of the substrate.

The adhesive tape 110 can define an aperture 111 sized and shaped in correspondence with a size and a shape of the sound-entry opening 101. For example, the aperture 111 through the adhesive tape 110 can be the same size and shape as the sound-entry opening (e.g., as in FIG. 3B), or the aperture 111 through the adhesive tape can be larger or shaped differently than the region of the substrate defining the sound-entry opening 101 (as in FIG. 3A).

In an embodiment, a package 100 as just described can be mounted on or otherwise be operatively coupled with another substrate, e.g., a further package-level substrate and/or an interconnect substrate. In the embodiments illustrated in FIGS. 2A and 2B, an optional, second package-level substrate 120 is positioned opposite the substrate 102 relative to the port membrane 108. In FIGS. 2A, 2B, 3A, and 3B, a second adhesive layer 122 is positioned between the port membrane 108 and the second substrate 120, securing the second substrate in a laminated arrangement with the first substrate 102 and the port membrane 108.

Figure 2B:
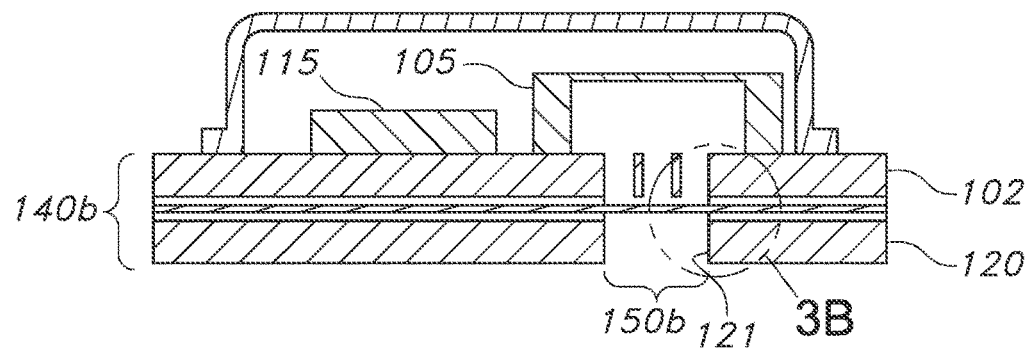
FIG. 2B illustrates a cross-sectional view of a liquid-resistant microphone assembly having a different substrate arrangement compared to the microphone assembly shown in FIG. 2A.

In FIGS. 2A and 2B, the second substrate 120 defines a sound entry opening 121 acoustically coupled with the sound-entry opening 101 defined by the first substrate 102, acoustically coupling the second sound-entry opening 121 with the sensitive region of the microphone transducer 105. The second sound-entry opening 121 through the second substrate 121 can be the same size and shape as the first sound-entry opening 101 (as in FIG. 2B), or the second sound-entry opening 121 through the second substrate 120 can be larger or otherwise shaped differently than the region of the substrate 102 defining the first sound-entry opening 101 (as in FIG. 2A). Similarly, the second sound-entry opening 121 through the second substrate 120 can be the same size and shape as each respective aperture 111, 123 through the adhesive tape layers 110, 122, respectively, or the second sound-entry opening 121 can be larger or shaped differently than the apertures through the layers of adhesive tape. In still another embodiment, the relative sizes and shapes of the sound-entry openings 101, 121 and apertures 111, 123 through the adhesive layers 110, 122, respectively, can be selected in any desired combination to tune the acoustic response of the liquid-resistant microphone assembly 100 at the microphone transducer 105.

As an example, each of the first sound-entry opening 101 and the second sound-entry opening 121 has a corresponding characteristic dimension. Flow or acoustic characteristics of an aperture may vary with a selected characteristic dimension of the aperture. In some instances, a characteristic dimension of a given structure can be defined in a manner to enable, e.g., acoustic or flow comparisons of structures having different shapes. For example, a characteristic dimension of a circle can be a diameter of the circle. On the other hand, a characteristic dimension of a square can be length of the side of the square, or a ratio of an area of the square to a perimeter of the square. Such a ratio is sometimes referred to in the art as a hydraulic diameter. For a circle, the ratio reduces to the diameter of the circle.

A substrate 140a, 140b, 140c, as viewed in FIG. 1A, can measure about 4.000 mm by about 3.500 mm. For example, in selected embodiments, each ordinate dimension can measure between about 2.500 mm and about 6.000 mm, such as, for example, between about 3.000 mm and about 5.000, or between about 3.300 mm and about 4.100 mm. Each aperture 101a defining a sound-entry opening through the first constituent substrate layer 102 can be a non-plated through via having a diameter measuring between about 50 μm and about 200 μm, such as, for example, between about 75 μm and about 150 μm, e.g., between about 90 μm and about 110 μm. The sound-entry region 150 can have a characteristic dimension, e.g., a diameter in selected embodiments, measuring between about 1.000 mm and about 3.000 mm, such as, for example, between about 1.200 mm and about 2.400 mm, e.g., between about 1.4 mm and about 2.2 mm.

As shown in FIG. 2A, the second sound-entry opening 121 can be larger than the sound-entry opening 101 defined by the first substrate 102. As well, the periphery of each adhesive layer 110, 122 is recessed from the periphery 121 of the second sound-entry opening. In a working embodiment, the relative sizes of the openings schematically illustrated in FIG. 2A were determined to provide improved acoustic response to an intended audio source at the microphone transducer 105 compared to an embodiment in which a periphery of the aperture through the layers of tape coincided with a periphery of the second sound-entry opening (as in FIG. 2B).

As FIGS. 2A and 3A show, an acoustic mesh 130 can be attached to a second major surface 124 of the second substrate 120, spanning across the second sound-entry opening 121. Such an acoustic mesh can provide a measure of acoustic damping at selected frequencies, further tuning the acoustic response of the liquid-resistant microphone assembly 100. As well, such an acoustic mesh can inhibit intrusion of debris into the sound-entry opening 150, which can damage the port membrane 108 or degrade acoustic performance of the package. In an embodiment, the acoustic mesh 130 can be formed from a woven-wire cloth. For example, stainless-steel filaments can be woven to define the mesh. As well, the filaments can be coated, e.g., with a hydrophobic or an oleophobic coating to further inhibit intrusion of debris or liquids.

Figure 2C:
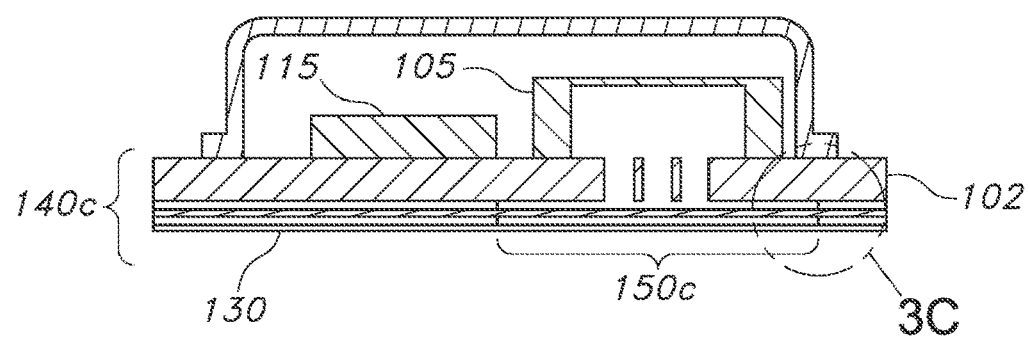
FIG. 2C illustrates a cross-sectional view of a liquid-resistant microphone assembly having a different substrate arrangement compared to the microphone assemblies shown in FIGS. 2A and 2B.
Figure 3C:
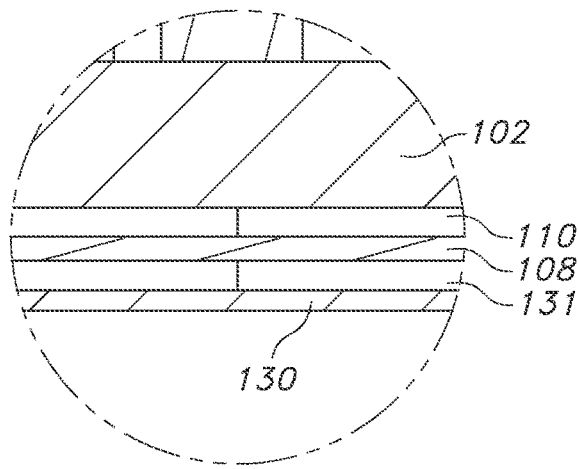

As FIGS. 2C and 3C show, the second substrate 120 can be omitted. Even when the second substrate 120 is omitted, the acoustic mesh 130 can be retained. For instance, the mesh 130 can be attached to the port membrane 108 opposite the first substrate 102. As with the arrangement of the port membrane 108 relative to the substrate 102, the mesh 130 can be spaced from the port membrane 108 by a thickness of an adhesive layer 131.

II. Liquid Resistant Microphone Modules

Referring now to FIG. 4A, a liquid-resistant microphone assembly 100 of the type described herein can be incorporated in a microphone module 250. For instance, the microphone module 250 can include a microphone transducer 105 (FIG. 2A) having a sound-responsive sensitive region. The microphone transducer 105 can be packaged in a liquid-resistant package acoustically coupled with an external ambient environment through a liquid-resistant sound entry opening 150. The microphone package 105 may include, for example, a micro-electro-mechanical system (MEMS) microphone. It is contemplated, however, that microphone transducer can be any type of electro-acoustic transducer operable to convert sound into an electrical output signal, such as, for example, a piezoelectric microphone, a dynamic microphone or an electret microphone.

Figure 4B:
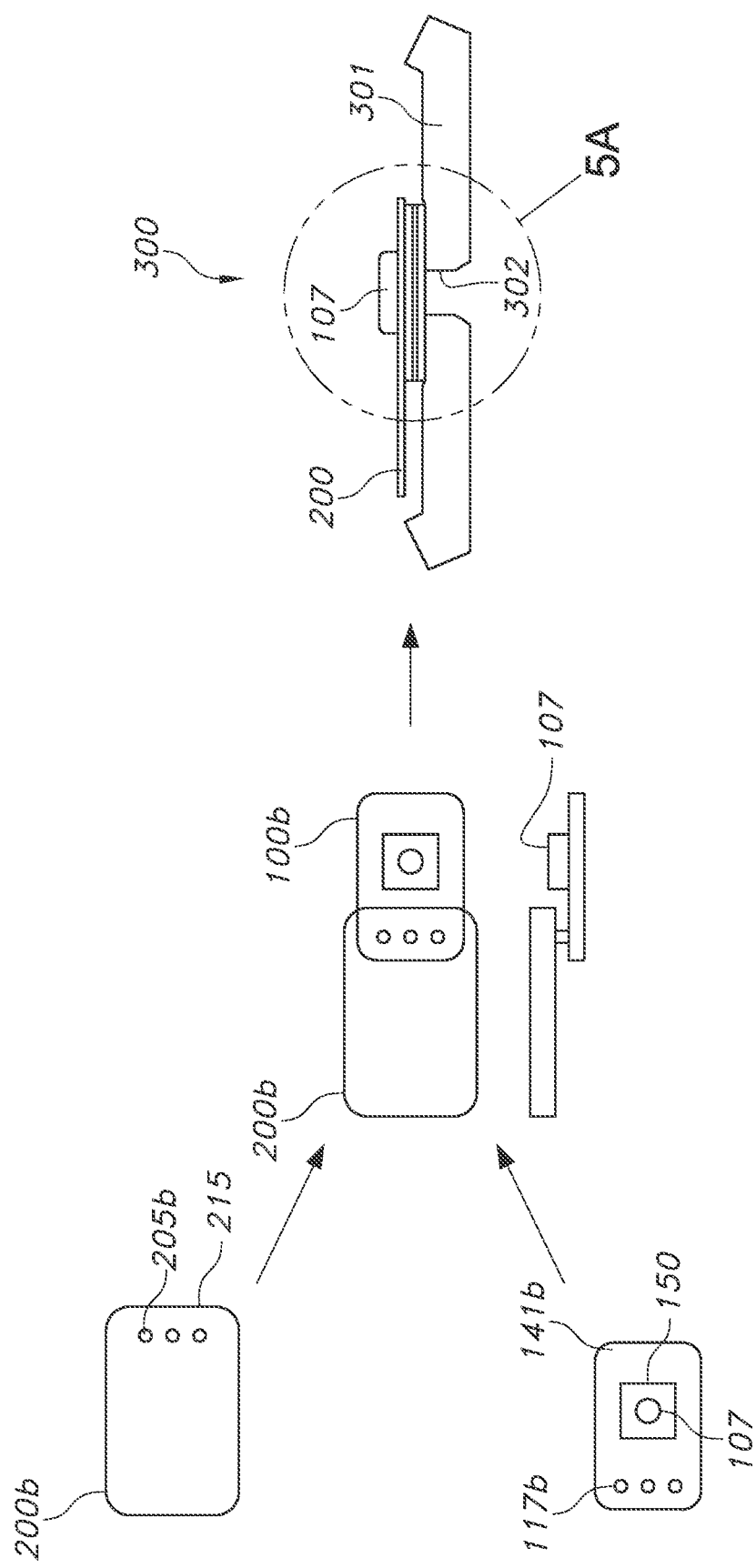
FIG. 4B illustrates several alternative components and sub-assemblies in an electronic device.

A microphone module 250 can include an interconnect substrate 200. As shown in FIGS. 4A and 4B, the liquid-resistant package 100a, 100b can be electrically coupled with a complementarily arranged interconnect substrate 200a, 200b. In general, an interconnect substrate 200a, 200b can include a plurality of electrical conductors configured to convey an electrical signal, or a power or a ground signal, from one interconnection location (e.g., a solder pad) 205a, 205b to another interconnection location (e.g., another solder pad). For example, a packaged component, e.g., the liquid-resistant microphone assembly 100a, 100b, can be soldered or otherwise electrically coupled with one or more interconnection locations defined by an interconnect substrate.

The interconnect substrate can electrically couple the packaged component with one or more other components (e.g., a memory device, a processing unit, a power supply) physically separate from the packaged component. In addition to the microphone transducer, one or more other components can be operatively coupled with the interconnect substrate 200a, 200b. For example, the interconnect substrate can have a region 210 extending away from the microphone package in one or more directions. Within that region 210, the electrical conductors to which the microphone package is electrically coupled can also extend away from the microphone package. Another component (not shown) can electrically couple with the electrical conductors, electrically coupling the microphone package with such other component. Examples of the other component can include a processing unit, a sensor of various types, and/or other functional and/or computational units of a computing environment or other electronic device.

In an embodiment, the interconnect substrate 200a, 200b can be a laminated substrate having one or more layers of electrical conductors juxtaposed with alternating layers of dielectric or electrically insulative material, e.g., FR4 or a polyimide substrate. Some interconnect substrates are flexible, e.g., pliable or bendable within certain limits without damage to the electrical conductors or delamination of the juxtaposed layers. The electrical conductors of a flexible circuit board may be formed of an alloy of copper, and the intervening layers separating conductive layers may be formed, for example, from polyimide or another suitable material. Such a flexible circuit board is sometimes referred to in the art as "flex circuit" or "flex." As well, the flex can be perforated or otherwise define one or more through-hole apertures.

As shown in FIGS. 4A and 4B, the microphone package 100a, 100b defines a plurality of exposed electrical contacts 117a, 117b configured to be soldered or otherwise electrically connected with a corresponding interconnection location 205a, 205b defined by the respective interconnect substrate 200a, 200b. In an embodiment, the electrical contacts 117a, 117b are exposed on a same side of the transducer package 100a, 100b as the sound-entry opening 150. In such an embodiment, the interconnect substrate 200a, 200b defines an aperture or other gas-permeable region (not shown) configured to permit an acoustic signal to pass therethrough in an acoustically transparent manner, or with a selected measure of damping, acoustically coupling an ambient environment with the sensitive region of the microphone transducer 105 through the interconnect substrate.

Referring now to FIG. 4A, the interconnect substrate 200a can define a first major surface 214, an opposed second major surface 217, and an aperture 206 extending through the interconnect substrate from the first major surface to the second major surface. In this embodiment, the package substrate 141a defines a plurality of electrical contacts 117a on a same side of the transducer substrate 141a as the lid 107. Stated differently, the electrical contacts 117a are positioned on a side of the transducer package 100a opposite the sound-entry opening 150. The microphone package 100a can be "inverted" and mounted to the second major surface 217 of the interconnect substrate 200a with the lid 107 of the package 100a extending through the aperture 206 in the electrical substrate. In the arrangement shown in FIG. 4A, the interconnect substrate 200a is spaced apart from the sound-entry opening 150 to the sensitive region of the microphone. As described more fully below, an arrangement having the interconnect substrate 200a overlie the package substrate 141a as just described can permit the sound-entry opening 150 of the microphone package 100a to be placed adjacent a port in an electronic device without sacrificing acoustic responsiveness of the microphone package.

In an embodiment as shown in FIG. 4B, the microphone package 100b has a plurality of electrical contacts 117b positioned adjacent a peripheral region of the package substrate 141b laterally outward of the lid 107. In FIG. 4B, the interconnect substrate 200b is electrically coupled with the electrical contacts 117b and is offset from a centerline of the microphone package 100b. Stated differently, the microphone package 100b extends past an edge 215 of the interconnect substrate (or vice-versa), as in a cantilevered relationship relative to the interconnect substrate. In an embodiment arranged as in FIG. 4B, the interconnect substrate 200b need not define an aperture through which the lid 107 of the package extends, as in the embodiment in FIG. 4A. That being said, the edge 215 of the interconnect substrate can define a laterally recessed region (not shown) and at recessed region can extend partially around the lid 107 or another vertically displaced component of the microphone package 100b.

In FIG. 4B, the electrical contacts as positioned adjacent one edge of the substrate 141b. In FIG. 4A, the electrical contacts are positioned adjacent a first edge of the substrate 141a and adjacent an opposed second edge of the substrate. With a package arrangement as in FIG. 4A, the package can be "inverted" with the lid 107 surrounded by the interconnect substrate.

A stiffener or other supporting member can be coupled with the interconnect substrate 200a, 200b, as to stiffen a region of the interconnection between the interconnect substrate and the microphone package 100a, 100b. For example, such a stiffener 210 (FIGS. 5A and 5B) can be adhesively laminated with the interconnect substrate 200a, 200b so as to stiffen the interconnect substrate in a region opposite the package substrate 141a, 141b and around the periphery of the lid 107. Such stiffening may be desirable to maintain or improve a long-term reliability of an electrical interconnection between the microphone transducer and electrical conductors in the interconnect substrate.

III. Liquid-Resistant Electronic Devices

An electronic device (e.g., a media appliance, a wearable electronic device, a laptop computer, a tablet computer, etc.) can incorporate a liquid-resistant microphone assembly 100 or a liquid-resistant microphone module 250 described herein. For example, referring to FIGS. 5A, 5B, an electronic device 300a, 300b can have a chassis having a chassis wall 301. The chassis wall 301 can define an aperture, e.g., a port 302, extending through the wall.

A sealable coupling between the liquid-resistant microphone assembly 100 and the chassis wall can be direct, as in FIG. 5A, or indirect as in FIG. 5B. A liquid-resistant microphone assembly 100 can define a region configured to sealably couple with a corresponding region of the chassis wall 301. In an embodiment, an interior surface 303 of the chassis wall 301 can define a gasket seat 315 (FIG. 5A) extending around an outer perimeter of an acoustic port 302 defined by the chassis wall. In another embodiment, an internal surface of the port 302 can define a gasket seat (FIG. 5B). In either arrangement, the liquid-resistant microphone assembly 100 can, directly or indirectly, sealably couple with such a gasket seat.

A liquid in which the electronic device is immersed may enter the port 302 in the chassis wall 301. However, the sealable coupling between the liquid-resistant microphone assembly 100 and the chassis wall 301 can inhibit intrusion of a surrounding liquid into an interior region 310 of the electronic device. As well, the liquid-resistant port membrane 108 can inhibit liquid from penetrating through the sound-entry opening 150 in the package substrate 140. Accordingly, an assembly as described above can inhibit entry of liquid to regions of the electronic device that may be susceptible to damage from liquid intrusion.

A sealable coupling between the liquid-resistant microphone assembly 100 can be a direct coupling, as in FIG. 5A. For example, the liquid-resistant microphone assembly 100 can define a region 160 extending outward of an around the sound-entry opening 150. The enclosure wall 301 can define a region, e.g., a gasket seat, complementarily configured relative to the region 160 extending around the sound-entry opening 150. A gasket member 306 can be positioned in compression between the liquid-resistant microphone assembly 100 and the region 315 of the housing wall. As an example, the gasket 306 can be a polymerized annulus (e.g., an O-ring) defining an open interior region extending from the port 302 through the housing wall 301 to the sound-entry region of the liquid-resistant microphone assembly 100. With such an arrangement, sound energy can pass through the port 302 defined by the housing wall and into the sound-entry opening 150.

A sealable coupling between the liquid-resistant microphone assembly 100 can be an indirect coupling, as in FIG. 5B. A housing 320 defining an acoustic duct or channel 325 can sealably couple with the liquid-resistant microphone assembly 100 laterally outward of the sound-entry opening 150. The housing 320 can extend transversely from the package substrate. In turn, the housing 320 can sealably couple with a region of the chassis wall 301 adjacent the port 302, as shown in FIG. 5B.

As in FIG. 5A, the wall 302 can define a region, e.g., a gasket seat, complementarily configured relative to a region of the housing 320 positioned distally from the package assembly 100. A gasket member 305 can be positioned in compression between the distal region of the housing 320 and the region of the enclosure wall 301. As an example, the gasket 305 can be a polymerized annulus (e.g., an O-ring) defining an open interior region extending around the housing 320 and being compressed between the housing 320 and the enclosure wall 301 adjacent or in the port 302. With such an arrangement, sound energy from the port 302 can pass through the acoustic duct 325 and into the sound-entry opening 150 of the package without obstruction.

As depicted in FIG. 5B, the housing 320 can extend from a first end (e.g., sealably coupled with the liquid-resistant microphone assembly 100) to an opposed second end (e.g., sealably coupled with the chassis wall 301). The acoustic duct 325 extends between the first end of the housing 320 and the second end of the housing. The housing 320 can be liquid-impermeable, e.g., formed from injection-molded plastic.

A terminal surface of the housing 320 corresponding to the first end of the housing can define a flange or other abutment, and the package substrate 140 can be adhesively coupled with the abutment. For example, a heat-activated film (HAF) or another adhesive can be positioned between the package substrate 140a, 140b, 140c and the abutment, and the HAF can affix the package substrate to the abutment.

As shown in FIG. 5B, the duct housing 320 can define an interior surface 321 facing the acoustic channel 325 and an exterior surface 322 in opposed relationship to the interior surface. The exterior surface 322 can define a recess extending around the outer periphery (e.g., circumferentially around) of the duct housing 325. For example, the recess can extend around the exterior surface at a position adjacent the second end (e.g., adjacent the port 302).

The recess can define a seat for a gasket 305, e.g., an O-ring. For example, the cross-sectional view in FIG. 5B shows a gasket 305 seated in the recess and positioned in compression between the exterior surface 322 of the housing 320 and a corresponding region of the chassis of an electronic device extending around a periphery of the port 302 through the chassis wall 301. The acoustic port 302 is aligned with or otherwise acoustically coupled with the acoustic channel 325 through the housing 320.

A protective barrier 310 (e.g., an acoustic mesh) can span across the channel 325 at a position between the port membrane 108 and the second end (e.g., port end) of the housing 320. The protective barrier can be porous, as to permit gas-movement across the barrier and yet inhibit particulate matter or other debris from intruding into the acoustic channel 325. In an embodiment, the protective barrier 310 can be a polyester-based acoustic mesh being acoustically transparent or having a selected measure of damping. In another embodiment, the protective barrier can include a wire mesh. In yet another embodiment, the protective barrier can include a gas-permeable, liquid-resistant material.

Although not shown, a mounting bracket can secure a liquid-resistant microphone module 300a, 300b in a liquid-resistant electronic device. For example, a mounting bracket can overlie and retain the microphone assembly in compression between the bracket and the chassis wall 301, maintaining a sealable coupling, e.g., in compression.

As may be needed or appropriate, one or more members in a liquid-resistant microphone module can be electrically grounded with a chassis (e.g., chassis wall 301) of the electronic device. For example, an electrically conductive tape or other electrical conductor can be electrically coupled to a grounding region on one or more of the microphone transducer and the interconnect substrate. The electrical conductor can electrically couple the respective grounding region with a grounding region of the chassis, or another selected common ground for the electronic device.

IV. Other Exemplary Embodiments

The examples described above generally concern liquid-resistant electronic devices, electro-acoustic transducers, and modules, as well as related systems. The previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

For example, FIGS. 2A, 2B, and 2C show a microphone package 100 in which the microphone transducer 105 is mounted to the first major surface of a substrate 140a, 140b, 140c. In another example, however, the microphone transducer 1005 and/or the ASIC 115 can be positioned within a recessed region of a package substrate.

FIG. 6 illustrates another embodiment of a liquid-resistant microphone package 500 having a package substrate 540 and a microphone transducer 505 mountably coupled with the package substrate. In FIG. 6, the substrate 540 defines a recess 541 having an outer periphery. The microphone transducer 505 is positioned within the recess.

Referring still to FIG. 6, the MEMS transducer 505 is held in place along its vertical edges. An arrangement as in FIG. 6 (and FIGS. 7A, 7B, and 7C) can reduce mechanical stress (and mechanical strain) imparted to the microphone transducer and its sensitive region arising from deformations to an interconnect substrate as compared to stress and strain imparted to the transducer through a surface-mounted arrangement as in FIGS. 2A, 2B, and 2C. Such decoupling can reduce or eliminate mechanically-induced or stress-induced noise into an audio signal by deformation of a sensitive region of the transducer 505, 605.

In the example shown in FIG. 6, the recess defines an aperture extending from the first major surface 530 to the second major surface 531 of a portion 502 (e.g., a first constituent substrate member) of the laminated substrate 540. An adhesive material 542 secures the microphone transducer 505 to the substrate portion 502. More particularly, in FIG. 6, the outer peripheral surface 505a of the microphone transducer 505 is attached to the outer periphery of the recess 541 defined by the substrate 540 with an adhesive material 542. For example, an adhesive material 542, sometimes referred to as "die attach," can extend around the outer peripheral surface 505a of the microphone transducer 505 and adhere to an inner surface of the recess 541 in the substrate.

To facilitate alignment of the microphone transducer 505, the recess 541 from the first major surface 530 need not extend entirely through the substrate 540 or the constituent portion 502 thereof. For example, a thin layer of the substrate can extend inwardly of an outer periphery of the microphone transducer 505. Such a "lip" or "tab" can support the microphone transducer 505 during assembly and before applying die attach in the gap between the outer periphery of the microphone transducer 505 and the inner surface of the recess 541 in the substrate.

As also shown in FIG. 6, an integrated circuit (IC), e.g., an application-specific IC (ASIC) can be positioned in the recess 541 at a position adjacent the microphone transducer 505. As well, an adhesive 543 can span a gap between the microphone transducer 505 and the ASIC 515, as well as the gap between the ASIC and the surrounding substrate recess 541. In another embodiment, the ASIC can be mounted, e.g., to the first major surface 530 of the substrate at a position adjacent the recess in the substrate. The ASIC can be electrically coupled with the suspended microphone transducer.

A bond wire 506 can electrically couple the microphone transducer 505 with the ASIC. In another embodiment, an electrical coupling (e.g., a solder ball) can extend from an electrode positioned on or adjacent the outer periphery of the microphone transducer 505 and a corresponding electrical contact defined by the substrate. An electrical trace or other electrical coupler can extend from the contact to another region defined by the substrate (e.g., a second electrical contact). The ASIC can be electrically coupled with the other region (e.g., the second electrical contact), electrically coupling the microphone transducer 505 and the ASIC 515 with each other.

The package substrate 540 defines a sound-entry region having a corresponding periphery. The package 500 further has a liquid-resistant membrane 508, and an adhesive layer 510 positioned between the membrane and the package substrate 502. The adhesive layer 510 defines an aperture having a corresponding periphery larger than the periphery of the sound-entry region defined by the package substrate. The adhesive layer adhesively secures the membrane 508 to the package substrate 502 such that the membrane spans across and is spaced apart from the sound-entry region. The package substrate comprises a plurality of electrical contacts 517, and each electrical contact can be electrically coupled with a corresponding electrical conductor in an interconnect substrate (not shown in FIG. 6).

Turning now to FIG. 7A, an alternative package arrangement is shown. In FIG. 7A, the microphone transducer 605 and the ASIC 615 is directly mounted to the liquid-resistant membrane 608, e.g., eliminating an intervening adhesive layer 510. That being said, an adhesive or other bonding agent coupling the microphone transducer 605 (and ASIC) to the membrane 608 may be placed between the microphone transducer 605 and the membrane 608. However, directly coupling the microphone transducer and the membrane together can eliminate, e.g., a carrier substrate (e.g., a polyimide substrate) of a double-sided adhesive as described above (e.g., in relation to FIG. 2) Eliminating the carrier substrate for the adhesive can further reduce a thickness of the package. In the arrangement shown in FIG. 7A, the sound-entry region 650 corresponds in size and shape to the sensitive region of the microphone transducer 650.

FIG. 7B shows another alternative package arrangement. In FIG. 7B, a substrate 620 is adhesively coupled with a package arrangement as in FIG. 7A, e.g., using an adhesive layer 622. Other forms of attachment, e.g., solder, between the substrate 620 and the package arrangement as in FIG. 7A can be used according to an intended function of the substrate 620. For example, the substrate 620 can be a further package substrate, e.g., carrying electrical signals associated with the microphone transducer 650 or the ASIC 615. In an embodiment, the substrate 620 can be an interconnect substrate. In an embodiment, the substrate 620 can be a stiffener substrate. For example, the substrate can enhance or modify a stiffness of the substrate 602, protecting a mechanical integrity of the bond between the microphone transducer 605 and the substrate 602 formed by the adhesive 643.

Figure 7C:
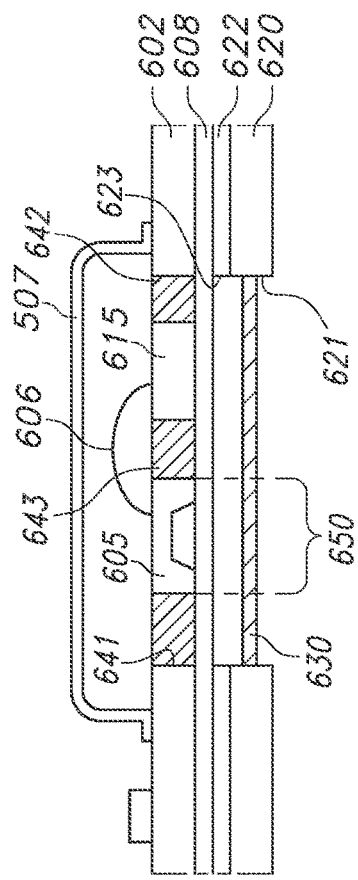
FIG. 7C illustrates a cross-sectional view of a microphone assembly similar to that in FIG. 7B with an added acoustic or other protective mesh spanning across a sound-entry opening.
Figure 8A:
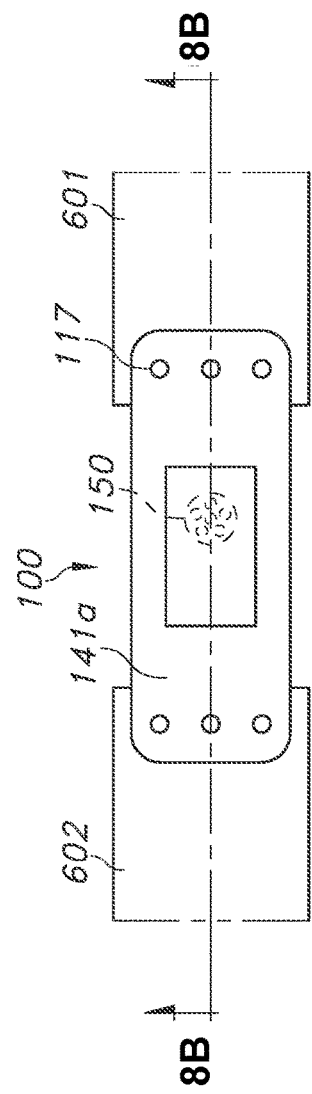
FIG. 8A illustrates a plan view of a liquid-resistant microphone assembly arranged as a "bridge" between first and second interconnect substrates.
Figure 8B:
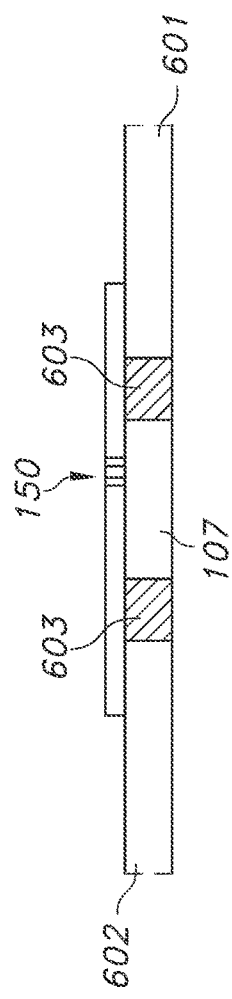
FIG. 8B illustrates a cross-sectional view of the assembly shown in FIG. 7A taken along Section line 8B-8B.
Figure 9A:
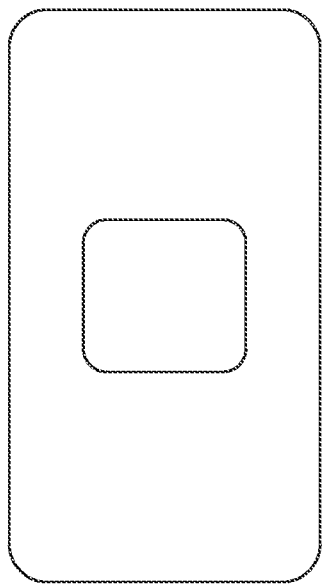
FIGS. 9A through 9D schematically illustrate alternative arrangements for a liquid-resistant microphone assembly.
Figure 9B:
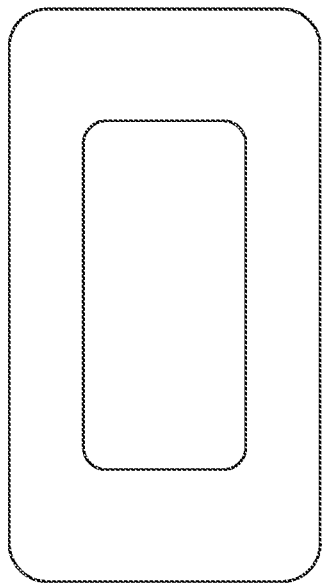
Figure 9C:
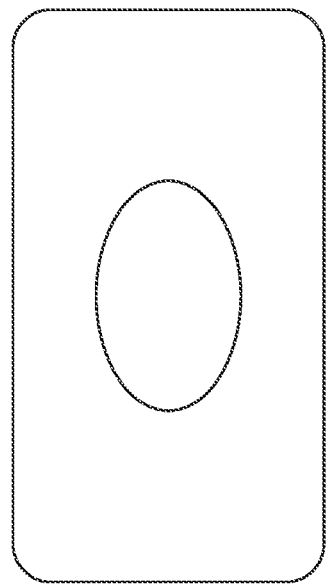
Figure 9D:
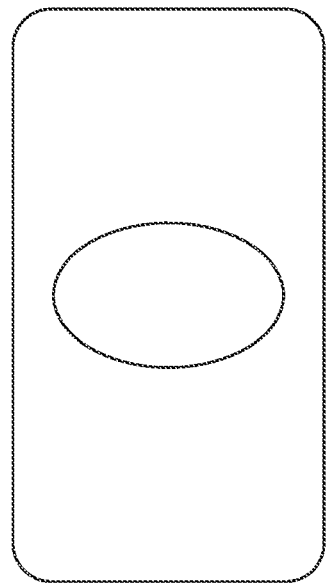

FIG. 7C illustrates yet another alternative package embodiment, similar to the embodiment shown in FIG. 7B. In FIG. 7C, a mesh 630 spans across the opening 621 defined by the substrate 620, overlying the sound entry opening 650. The mesh 630 can be acoustically transparent or can provide a selected degree of acoustic damping, similar to the mesh shown and described in relation to FIG. 2C and FIG. 5B. The mesh 630 can be positioned within the opening 621, as illustrated, or can be adhered to the substrate 620, similarly to the arrangement in FIG. 2C As depicted in FIG. 8A, a first interconnect substrate 601 can electrically couple with a first plurality of contacts 117 adjacent the first edge of the substrate 141a and a second interconnect substrate 602 can electrically couple with a second plurality of contacts adjacent the opposed second edge of the substrate 141a. With an arrangement as in FIG. 8A, the microphone package 100 defines a "bridge" spanning a gap positioned between two interconnect substrates 601, 602.

Although electrical contacts for liquid-resistant packages are illustrated as being positioned adjacent a single edge (e.g., in FIG. 4B) or an opposed pair of edges (e.g., in FIG. 4A), an embodiment can have electrical contacts positioned adjacent, e.g., three or more, edges of the substrate, and an embodiment can have electrical contacts positioned adjacent adjacent edges of the substrate (e.g., rather than adjacent opposed edges of the substrate).

Although laminated substrate assemblies 140a, 140b, 140c, 540 are shown and described above in relation to circular and annular structures, the laminated assemblies are not so limited in shape. FIGS. 9A, 9B, 9C, and 9D show several plan elevation views of alternative substrate assemblies having differently shaped sound-entry regions. For example, disclosed assemblies can have an elongated or an irregular outer periphery shape, such as, for example, an oblong shape, a rectangular shape, an ovoid shape, etc. Similarly, a cross-sectional shape of disclosed acoustic channels and acoustic ports and other structure, including for example, apertures and sound-entry regions, need not be limited to circular shapes. Rather, any suitable shape (e.g., an elongated or irregular shape) may be used. And, no component of any assembly described herein needs to be axi-symmetric. Rather, such component can have any suitable regular or irregular arrangement. Stated differently, disclosed devices, acoustic ducts, ports, vents and channels need not be coaxially arranged or concentric with the corresponding module through which they extend. Accordingly, disclosed devices, acoustic ducts, ports, vents, and channels can be positioned off-center relative to the module of which they are part.

And, a substrate having a gas-permeable and water-resistant region need not have a perforation or other aperture laminated with a port membrane, as generally described above. Rather, a suitable process can be used to distribute, apply, deposit, adhere, or otherwise attach a porous, gas-permeable and liquid-resistant membrane to a gas-permeable region of a substrate. For example, polymerized fibers can be deposited directly to the perforated support structure using an electrospinning process. As but one particular example, electrospinning can deposit PVDF fibers to a skeletal structure. Electrospinning and other deposition processes can eliminate the need for laminated, adhesive bonds as described above, while still providing a cap with a gas-permeable and liquid-resistant ported region.

Apertures or perforations (or, more generally, gas-permeable region) extending through each successive layer of material between a sensitive region of a microphone transducer and a port or other sound-entry opening can be successively larger than (or smaller than, or equal in size to) the gas-permeable region through an immediately adjoining layer. Selectively sizing the gas-permeable region through each layer can aid in tuning an acoustic response of the acoustic pathway between, e.g., an external port and a sensitive region of the microphone transducer.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of liquid-resistant electronic devices, electro-acoustic transducers, and modules, as well as related systems. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of liquid-resistant electronic devices, electro-acoustic transducers, and modules, as well as related systems, that can be devised under disclosed and claimed concepts.

Moreover, nothing disclosed herein is intended to be dedicated to the public regardless of whether such disclosure is explicitly recited in the claims. To aid the Patent Office and any readers of any patent issued on this application in interpreting the claims appended hereto or otherwise presented throughout prosecution of this or any continuing patent application, applicants wish to note that they do not intend any claimed feature to be construed under or otherwise to invoke the provisions of 35 USC 112(f), unless the phrase "means for" or "step for" is explicitly used in the particular claim.

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more".

Thus, in view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

We currently claim:

1. A liquid-resistant microphone assembly comprising:
   a first substrate defining opposed first and second major surfaces and a sound-entry region extending through the substrate from the first major surface to the second major surface;
   a microphone transducer coupled with the first substrate and having a sound-responsive region;
   a liquid-resistant port membrane spanning across the sound-entry opening defined by the first substrate;
   an adhesive layer positioned between the second major surface of the first substrate and the liquid-resistant port membrane, coupling the liquid-resistant port membrane with the second major surface of the first substrate and spacing the liquid-resistant port membrane from the second major surface of the substrate, forming a gap between the membrane and the second major surface of the first substrate, wherein the adhesive layer defines an aperture having a periphery extending around the sound-entry region and positioned outward of the sound-entry region;
   a second substrate positioned opposite the first substrate relative to the port membrane; and
   a housing extending from a first end to an opposed second end, wherein the housing defines a duct extending from the first end of the housing to the second end of the housing, wherein the second end of the housing sealably couples with the second substrate at a region outward of the sound-entry opening.

2. The liquid-resistant microphone assembly according to claim 1, wherein the microphone transducer comprises a MEMS microphone transducer.

3. The liquid-resistant microphone assembly according to claim 1, wherein the sound entry region comprises a plurality of apertures extending from the first major surface of the substrate to the second major surface of the substrate, wherein each aperture acoustically couples with the sound-responsive region of the microphone transducer.

4. The liquid-resistant microphone assembly according to claim 1, wherein the microphone transducer is coupled to the first major surface of the substrate.

5. The liquid-resistant microphone assembly according to claim 1, wherein the microphone transducer is coupled with the substrate at a position between the first major surface and the second major surface.

6. The liquid-resistant microphone assembly according to claim 1, wherein the second substrate is adhesively coupled with the first substrate.

7. The liquid-resistant microphone assembly according to claim 6, wherein the adhesive layer comprises a first adhesive layer, the liquid-resistant microphone assembly further comprising a second adhesive layer positioned between the liquid-resistant port membrane and the second substrate, coupling the second substrate to the liquid-resistant port membrane.

8. The liquid-resistant microphone assembly according to claim 1, wherein the sound-entry opening comprises a first sound-entry opening, the second substrate defines a second sound-entry opening acoustically coupled with the first sound-entry opening and the sound-responsive region of the microphone transducer.

9. The liquid-resistant microphone assembly according to claim 8, wherein the first sound-entry opening has a corresponding first characteristic dimension and the second sound-entry opening has a corresponding second characteristic dimension, wherein the second characteristic dimension is greater than the first characteristic dimension.

10. The liquid-resistant microphone assembly according to claim 9, wherein the aperture through the first adhesive layer has a characteristic dimension larger than the characteristic dimension of the first sound-entry opening and larger than the characteristic dimension of the second sound-entry opening.

11. The liquid-resistant microphone assembly according to claim 9, wherein the second adhesive layer defines an aperture having a characteristic dimension larger than the characteristic dimension of the first sound-entry opening and larger than the characteristic dimension of the second sound-entry opening.

12. The liquid-resistant microphone assembly according to claim 8, further comprising an acoustic mesh spanning across the second sound-entry opening.

13. The liquid-resistant microphone assembly according to claim 1, further comprising an acoustic mesh spanning across the duct at a position between the first end of the housing and the second end of the housing.

14. A microphone module, comprising:
an interconnect substrate having a plurality of electrical conductors and defining a first aperture; and
a liquid-resistant microphone package having:
a package substrate comprising a plurality of electrical contacts, each electrical contact electrically coupling with a corresponding electrical conductor in the interconnect substrate, the package substrate defining a first major surface, an opposed second major surface, and a sound-entry region having a corresponding periphery, wherein the sound-entry region is positioned adjacent the second major surface, the plurality of electrical contacts are exposed from the first major surface, and the interconnect substrate is positioned adjacent the first major surface;
a microphone transducer coupled with the package substrate;
a liquid-resistant membrane;
an adhesive layer positioned between the membrane and the package substrate,
the adhesive layer defining a second aperture having a corresponding periphery larger than the periphery of the sound-entry region defined by the package substrate and adhesively securing the membrane to the package substrate such that the membrane spans across and is spaced apart from the sound-entry region; and
a lid overlying the microphone transducer adjacent the first major surface, wherein the lid extends through the first aperture.

15. An electronic device, comprising:
an enclosure having a wall, wherein the wall defines an acoustic port;
a liquid-resistant microphone assembly having a microphone transducer defining a sound-responsive region and a package substrate defining a liquid-resistant sound-entry region acoustically coupling the sound-responsive region with the acoustic port, wherein a periphery around the liquid-resistant sound-entry region sealably couples with a periphery around the acoustic port;
wherein the package substrate comprises a laminated construct comprising:
a first substrate layer defining a perforated region corresponding to the sound-entry region and having a corresponding periphery, wherein the microphone transducer is coupled with the first substrate layer such that the sound-responsive region of the microphone transducer is exposed to the sound-entry region;
a liquid-resistant membrane layer spanning across the sound-entry region;
a first adhesive layer positioned between the first substrate layer and the membrane layer, adhesively coupling the membrane layer with the first substrate layer, wherein the first adhesive layer defines an aperture having a periphery extending around and positioned outward of the sound-entry region, forming a gap positioned between the membrane layer and the first substrate layer within the sound-entry region of the package substrate;
a second substrate layer positioned opposite the first substrate layer relative to the membrane layer, wherein the second substrate layer defines a perforated region acoustically coupled with the sound-responsive region of the microphone transducer, wherein the perforated region defined by the second substrate region has a corresponding periphery larger than the periphery of the perforated region of the first substrate; and
a second adhesive layer positioned between the second substrate layer and the membrane layer, wherein the second adhesive layer adhesively couples the second substrate layer with the membrane layer, wherein the second adhesive layer defines a corresponding aperture having a periphery, wherein the periphery of the second adhesive layer is positioned outward of the periphery of the perforated region of the first substrate layer and outward of the periphery of the perforated region of the second substrate layer.

16. The microphone module according to claim 14, wherein the microphone transducer is coupled to the first major surface of the package substrate.

17. The microphone module according to claim 14, wherein the microphone transducer is coupled with package substrate at a position between the first major surface and the second major surface.

18. The microphone module according to claim 14, wherein the package substrate comprises a first substrate layer, the microphone module further comprising a second substrate layer positioned opposite the first substrate layer relative to the liquid-resistant membrane.

19. The microphone module according to claim 18, wherein the microphone transducer has a sound-responsive region, wherein the sound-entry region comprises a first sound-entry region, wherein the second substrate defines a second sound-entry region acoustically coupled with the first sound-entry region and the sound-responsive region of the microphone transducer.

20. The microphone module according to claim 19, further comprising an acoustic mesh spanning across the second sound-entry opening.

21. The microphone module according to claim 14, further comprising an acoustic mesh positioned opposite the package substrate relative to the liquid-resistant membrane, wherein the acoustic mesh is spaced apart from the liquid-resistant membrane, defining a gap between the acoustic mesh and the sound-entry region.

22. The electronic device according to claim 15, further comprising a housing extending from a first end to an opposed second end, wherein the housing defines a duct extending from the first end of the housing to the second end of the housing, wherein the second end of the housing sealably couples with the second substrate at a region outward of the sound-entry opening, wherein the first end of the housing sealably couples with the wall, coupling the duct with the acoustic port.

23. The electronic device according to claim 15, further comprising an acoustic mesh spanning across the duct.

\* \* \* \* \*

UNITED STATES PATENT AND TRADEMARK OFFICE
CERTIFICATE OF CORRECTION

PATENT NO. : 10,587,942 B1
APPLICATION NO. : 16/146983
DATED : March 10, 2020
INVENTOR(S) : Anthony D. Minervini et al.

It is certified that error appears in the above-identified patent and that said Letters Patent is hereby corrected as shown below:

In the Claims

In Claim 8 (Column 18, Line 46), the recitation 'sound-entry opening, the second substrate' should read – sound-entry opening, wherein the second substrate –.

Signed and Sealed this
Fifth Day of May, 2020

Andrei Iancu
*Director of the United States Patent and Trademark Office*